United States Patent
Nakazawa et al.

(10) Patent No.: US 6,870,667 B2
(45) Date of Patent: Mar. 22, 2005

(54) OPTICAL AMPLIFIER

(75) Inventors: Satoru Nakazawa, Yokohama (JP); Yasunori Murakami, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 296 days.

(21) Appl. No.: 10/305,362

(22) Filed: Nov. 27, 2002

(65) Prior Publication Data

US 2003/0128422 A1 Jul. 10, 2003

Related U.S. Application Data (60) Provisional application No. 60/335,827, filed on Dec. 5, 2001.

(30) Foreign Application Priority Data

Nov. 27, 2001 (JP) .................. P2001-361133

(51) Int. Cl.[7] ............................................. H01S 3/00
(52) U.S. Cl. .................... 359/341.31; 359/344
(58) Field of Search ......................... 359/341.31, 344

(56) References Cited

U.S. PATENT DOCUMENTS

| | | | | | |
|---|---|---|---|---|---|
| 3,840,889 | A | * | 10/1974 | O'Brien et al. | 372/36 |
| 5,229,879 | A | * | 7/1993 | Gen-ei | 359/344 |
| 5,414,554 | A | * | 5/1995 | Aoyama | 359/344 |
| 6,046,842 | A | * | 4/2000 | Tiemeijer | 359/344 |
| 6,111,688 | A | * | 8/2000 | Kobayashi et al. | 359/337.13 |
| 6,220,767 | B1 | * | 4/2001 | Bookbinder | 385/94 |
| 6,236,668 | B1 | * | 5/2001 | Osada et al. | 372/34 |
| 6,366,396 | B1 | * | 4/2002 | Hayashi | 359/344 |
| 6,381,066 | B1 | * | 4/2002 | Korn et al. | 359/344 |
| 6,614,823 | B2 | * | 9/2003 | Funabashi et al. | 372/45 |
| 6,704,137 | B2 | * | 3/2004 | Hamada | 359/341.3 |
| 6,765,935 | B2 | * | 7/2004 | Kimura et al. | 372/29.02 |
| 6,768,577 | B2 | * | 7/2004 | Eggleton et al. | 359/335 |
| 6,782,028 | B2 | * | 8/2004 | Tsukiji et al. | 372/75 |
| 6,810,173 | B2 | * | 10/2004 | Evans et al. | 385/27 |
| 2001/0038498 | A1 | * | 11/2001 | Furuhashi et al. | 359/819 |
| 2002/0094158 | A1 | * | 7/2002 | Evans et al. | 385/27 |

FOREIGN PATENT DOCUMENTS

JP          06-5954          1/1994          ........... H02S/3/094

OTHER PUBLICATIONS

Shah et al. Packaging technology for high–power, singlemode–fiber–pigtailed pump laser modules for Er–doped fiber amplifiers. Electronic Components and Technology Conference 1992 Proceedings, 42nd. May 18, 1992 to May 20, 1992, pp. 842–847.*

* cited by examiner

*Primary Examiner*—Thomas H. Tarcza
*Assistant Examiner*—Deandra M. Hughes
(74) *Attorney, Agent, or Firm*—McDermott Will & Emery LLP (57) ABSTRACT

Optical amplifier according to the present invention is provided with an EDF, a light source device having a semiconductor laser element that generates an excitation beam and a housing that accommodates this, and an optical multiplexer having an input optically coupled with light source device, an input that receives the signal beam, and an output that provides an excitation beam and signal beam to EDF. Semiconductor laser element has an active layer, provided between cladding layers and including compound semiconductors of mutually different conductivity types, that includes a compound semiconductor and is constructed such that the oscillation wavelength at 20° C. of this semiconductor laser element is less than 1470 nm but not less 1440 nm. If this is done, the change of gain in EDF with respect to oscillation wavelength can be made satisfactorily small and the NF can be made satisfactorily small.

15 Claims, 6 Drawing Sheets

OPTICAL AMPLIFIER

CROSS-REFERENCE TO RELATED APPLICATION

This application claims priority to Provisional Application Ser. No. 60/335,827 filed Dec. 5, 2001, which is hereby incorporated by reference in its entirety.

BACKGROUND OF THE INVENTION

1. Field of the Invention

The present invention relates to an optical amplifier.

2. Related Background Art

In WDM (Wavelength Division Multiplexing) transmission systems, in which signal beams consisting of components of a large number of wavelengths are transmitted by introducing these simultaneously into an optical fiber path, optical amplifiers are employed at relay stations etc to make up for transmission losses occurring when these signal beams of multiple wavelengths are transmitted over a long distance. In addition, optical amplifiers are likewise employed to make up transmission losses in passive optical devices (such as for example AWG: Arrayed Wavelength Grating) within relay stations.

Such optical amplifiers are constituted comprising an optical amplification section that amplifies an input signal beam before outputting it and that is obtained by doping with a fluorescent substance capable of excitation by an excitation beam, and an excitation light source device that emits the excitation beam that is supplied to this optical amplification section. For the optical amplification section, Er-doped fiber (EDF: Erbium-Doped fiber) obtained by adding erbium (hereinbelow abbreviated as "Er") to optical fiber is commonly employed. 1480 nm is commonly used as the wavelength of the excitation beam of this Er-doped fiber; when an excitation beam of this wavelength is supplied to Er-doped fiber, the Er is excited by the optical energy possessed by this excitation beam, causing an inverted distribution condition to be formed by the Er, so that the phenomenon of stimulated emission occurs on input of a signal beam, causing the signal beam to be amplified.

In addition, the excitation light source device comprises a semiconductor laser element that generates the excitation beam. Two types of excitation light source device are known: a type comprising a cooling element for cooling the semiconductor laser element and a type not comprising a cooling element. Of these, an excitation light source device not having a cooling element (hereinbelow called a "non-temperature regulated excitation light source device") is considered desirable since it can be made of small size and low cost. Such a non-temperature regulated excitation light source device having an excitation beam oscillation wavelength of 1480 nm at 20° C. is previously known.

SUMMARY OF THE INVENTION

However, the conventional non-temperature regulated excitation light source device referred to above has the following problems.

Specifically, in a non-temperature regulated excitation light source device, when the temperature of the semiconductor laser element becomes high, the oscillation wavelength of the semiconductor laser element shifts into a wavelength region longer than 1480 nm; however, when the oscillation wavelength becomes longer than 1480 nm, the gain in the Er-doped optical fiber abruptly decreases, so there was the problem that the gain in the Er-doped optical fiber was very different at different wavelengths.

An object of the present invention is to provide an optical amplifier wherein the wavelength dependence of gain in the Er-doped optical fiber can be made sufficiently small.

As a result of meticulous study aimed at solving the above problem, the present inventors discovered that the above problem could be solved by employing a semiconductor laser element wherein the oscillation wavelength at 20° C. is less than 1470 nm but not less than 1440 nm in a so-called non-temperature regulated excitation light source device, and thereby perfected the present invention.

Specifically, an optical amplifier according to the present invention comprises: an erbium-doped optical fiber; an excitation light source device having a semiconductor laser element that generates an excitation beam and a housing that accommodates said semiconductor laser element; and an optical multiplexer having a first input optically coupled with said excitation light source device, a second input for receiving a signal beam and an output for supplying said excitation beam and signal beam to said erbium-doped optical fiber; said semiconductor laser element comprising: a first cladding layer that includes chemical compound semiconductor of said first conductivity type; a second cladding layer that includes chemical compound semiconductor of said second conductivity type; and an active layer including chemical compound semiconductor, provided between said first cladding layer and said second cladding layer and constituted such that the oscillation wavelength of said semiconductor laser element at 20° C. is less than 1470 nm but not less than 1440 nm.

Also, an optical amplifier according to the present invention comprises: an erbium-doped optical fiber; an excitation light source device having a semiconductor laser element that generates an excitation beam and a housing that accommodates said semiconductor laser element; and an optical multiplexer having a first input optically coupled with said excitation light source device, a second input for receiving a signal beam and an output for supplying said excitation beam and signal beam to said erbium-doped optical fiber; said semiconductor laser element comprising: a first cladding layer that includes InP semiconductor of said first conductivity type; a second cladding layer that includes InP semiconductor of said second conductivity type; and an active layer including chemical compound semiconductor, provided between said first cladding layer and said second cladding layer and constituted such that the oscillation wavelength of said semiconductor laser element at 20° C. is less than 1470 nm.

Furthermore an optical amplifier according to the present invention comprises: an erbium-doped optical fiber; an excitation light source device having a semiconductor laser element that generates an excitation beam and a housing that accommodates said semiconductor laser element; and an optical multiplexer having a first input optically coupled with said excitation light source device, a second input for receiving a signal beam and an output for supplying said excitation beam and signal beam to said erbium-doped optical fiber; said semiconductor laser element comprising: a first cladding layer that includes InP semiconductor of said first conductivity type; a second cladding layer that includes InP semiconductor of said second conductivity type; and an active layer having a multiple quantum well construction and provided between said first cladding layer and said second cladding layer, having a barrier layer and well layer including GaInAsP semiconductor and constituted such that the oscillation wavelength of this semiconductor laser element at 20° C. is less than 1470 nm.

With these inventions, when voltage is applied between the first cladding layer and second cladding layer, an excitation beam of oscillation wavelength less than 1470 nm is emitted from the active layer of the semiconductor laser element. This excitation beam is supplied to the Er-doped optical fiber, through the first input and output of the optical multiplexer. A signal beam is input to the Er-doped optical fiber through the second input and output of the optical multiplexer. This signal beam is then optically amplified within the Er-doped optical fiber. Since the oscillation wavelength at 20° C. in the semiconductor laser element is set on the short wavelength side of 1480 nm, which is the peak wavelength for the gain, the amount of change of the gain in the EDF with respect to the amount of change of the oscillation wavelength is satisfactorily small. The difference in the gain between the case where the temperature of the semiconductor laser element is high and the case where it is low can therefore be made satisfactorily small.

Also, an optical amplifier according to the present invention comprises: an erbium-doped optical fiber; a first excitation light source device constituted by said excitation light source device of said optical amplifier; a first optical multiplexer having a first input optically coupled with said first excitation light source device, a second input for receiving a signal beam and a first output for outputting said excitation beam and signal beam to said erbium-doped optical fiber; a second excitation light source device constituted by said excitation light source device of said optical amplifier; and a second optical multiplexer having a third input optically coupled with said second excitation light source device, a fourth input for receiving a signal beam and outputting an excitation beam to said erbium-doped optical fiber and a second output that outputs said signal beam.

With these inventions, when voltage is applied between the first cladding layer and second cladding layer in the first excitation light source device, an excitation beam of oscillation wavelength less than 1470 nm is emitted from the active layer of the semiconductor laser element. This excitation beam is supplied to the Er-doped optical fiber, through the first input and first output of the first optical multiplexer. When voltage is applied between the first cladding layer and second cladding layer in a second excitation light source device, an excitation beam of oscillation wavelength less than 1470 nm is emitted from the active layer of the semiconductor laser element. This excitation beam is supplied to the Er-doped optical fiber through the third input and fourth input of the second optical multiplexer. Concurrently, the signal beam is input to the Er-doped optical fiber through the second input and first output of the first optical amplifier. Thus, the signal beam is optically amplified in the Er-doped optical fiber. In the semiconductor laser elements of the first excitation light source device and second excitation light source device, the oscillation wavelength at 20° C. is set on the short wavelength side of 1480 nm, which is the wavelength of peak gain, so the amount of change of the gain in the Er-doped optical fiber with respect to the amount of change of the oscillation wavelength can be made satisfactorily small. Consequently, the difference of gain in the Er-doped optical fiber in the case where the temperature of the semiconductor laser element is high and in the case where it is low can be made satisfactorily small.

DESCRIPTION OF THE PREFERRED EMBODIMENTS

Figure 1:
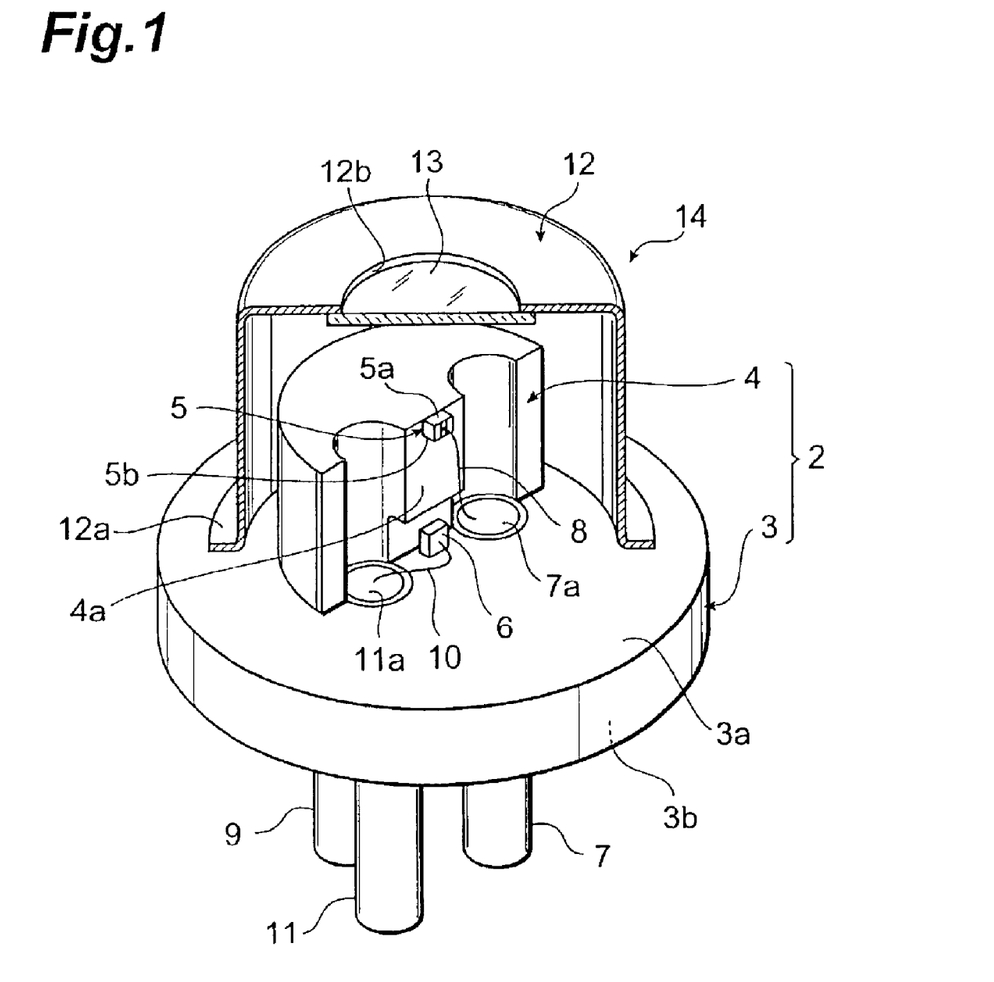
FIG. 1 is a perspective view, part cutaway, illustrating an embodiment of an excitation light source device employed in an optical amplifier according to the present invention.

An embodiment of the present invention is described in detail below. FIG. 1 is a partly cutaway perspective view illustrating an embodiment of an excitation light source device used in an optical amplifier according to the present invention, being a so-called non-temperature regulated excitation light source device. As shown in FIG. 1, excitation light source device 1 comprises a mounting member made of metal called a stem 2. This stem 2 comprises a disc-shaped base 3 and a mounting portion 4 which is half-moon shaped in cross section. Base 3 has a flat face 3a and a mounting portion 4 is provided so as to extend integrally from flat face 3a. Mounting portion 4 comprises a mounting face 4a which is perpendicular with flat face 3a; a semiconductor laser element 5 that generates laser light is fixed by solder or the like to mounting face 4a. Semiconductor laser element 5 comprises a first end face 5a that emits the laser beam and a second end face 5b opposite to first end face 5a, first end face 5a and second end face 5b being fixed to mounting face 4a so as to be perpendicular to mounting face 4a. The optical axis 43 of the laser beam is practically orthogonal to first end face 5a.

Also on flat face 3a there is fixed a photodiode 6 for monitoring purposes, facing second end face 5b; the laser beam emitted from second end face 5b is monitored by monitoring photodiode 6.

Also, a first conductive pin 7 extending straight out is fixed to base 3 of stem 2, the tip 7a of first conductive pin 7 being exposed on the side of flat face 3a of base 3. Also, the tip 7a of first conductive pin 7 is conductively connected with semiconductor laser element 5 by means of a first wire 8 made of Au or Al. Also, a second conductive pin 9 extending straight out is provided on the back face 3b of base 3 of stem 2; second conductive pin 9 functions as a terminal for use as a gland, being connected with stem 2. In addition, a third conductive pin 11 extending straight out is fixed by means of an insulator to base 3 of stem 2, the tip 11a of this third conductive pin 11 being exposed on the side of flat face 3a of base 3. Also, the tip 11a of third conductive pin 11 is connected with photodiode 6 for monitoring purposes by means of a second wire 10 made of Au or Al.

Each of first conductive pin 7, second conductive pin 9 and third conductive pin 11 extend in the direction of emission of the laser beam emitted from semiconductor laser element 5. Base 3, mounting portion 4 and second conductive pin 9 are all constructed of the same material (for example Fe or Cu etc).

Furthermore, a cap-shaped cover member 12 is provided above flat face 3a of base 3 so as to cover mounting portion 4. Cover member 12 comprises a flange 12a, flange 12a and flat face 3a being joined by welding. In addition, an aperture 12b is formed in cover member 12, a glass window (optical window) 13 being welded so as to block aperture 12b. Glass window 13 is arranged in a position intersecting with the optical axis 43 of semiconductor laser element 5. The laser beam from semiconductor laser element 5 therefore passes through glass window 13. A housing 14 is constituted by cover member 12 and stem 2. Dry nitrogen is sealed within housing 14, so that performance deterioration of the semiconductor laser element 5 is completely prevented.

Figure 2:
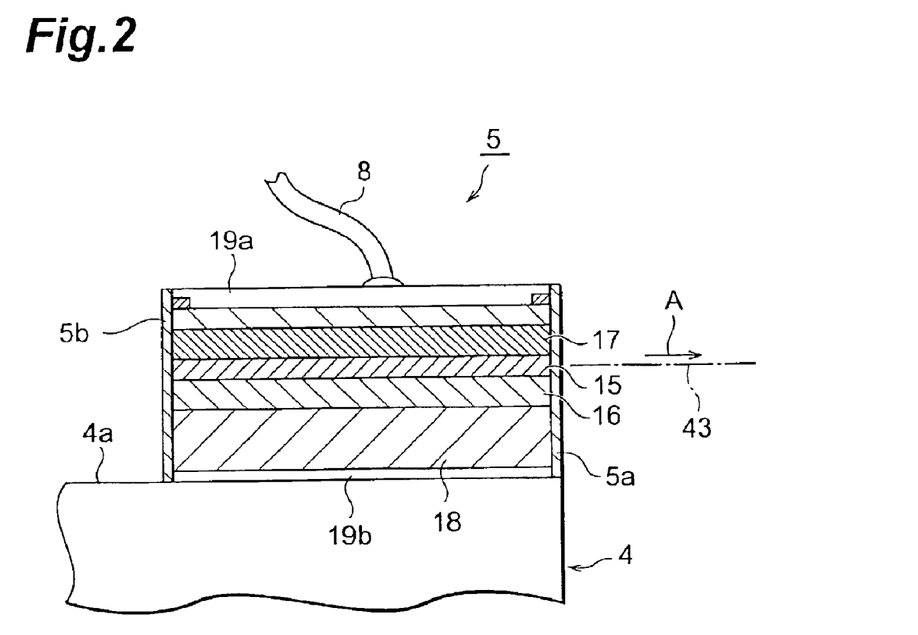
FIG. 2 is a cross-sectional view illustrating the construction of the semiconductor laser element of FIG. 1.

FIG. 2 is a cross-sectional view of semiconductor laser element 5. As shown in FIG. 2, in semiconductor laser element 5, an active layer 15 that generates and amplifies light when carriers are injected therein and a first cladding layer 16 and a second cladding layer 17 that sandwich active layer 15 are provided on a semiconductor substrate 18. First cladding layer 16 includes a chemical compound semiconductor of a first conductivity type and has a refractive index lower than that of active layer 15. Second cladding layer 17 includes a chemical compound semiconductor of a second conductivity type and has a refractive index lower than that of active layer 15. Semiconductor laser element 5 is an element wherein laser oscillation is generated by the forming of an inverted distribution by injection of carriers into active layer 15 from the first cladding layer 16 and second cladding layer 17 on both sides thereof.

As described above, semiconductor laser element 5 comprises a first end face 5a and a second end face 5b facing this. The optical reflectivity of first end face 5a is smaller than the optical reflectivity of second end face 5b. In order to achieve this, reflectivity of about 0.1 to 3% is achieved by the provision of a low reflectivity film on first end face 5a, so that practically all of the light passes through first end face 5a. In contrast, a highly reflective film is provided on second end face 5b, so that reflectivity of 80% or more is achieved. Consequently, the first end face 5a becomes the optical emission face and the second end face 5b becomes the optical reflection face. The laser beam is emitted in the direction shown by arrow A in FIG. 2.

Electrode 19a of semiconductor laser element 5 is connected with first conductive pin 7 through first wire 8 and electrode 19b thereof is conductively connected with second conductive pin 9 through mounting portion 4 and base 3. When excitation light source device 1 is employed, the positive electrode of a power source (not shown) is connected with first conductive pin 7 and the negative electrode of the power source is connected with second conductive pin 9. The power source is a power source for applying current required for producing laser oscillation in semiconductor laser element 5 to semiconductor laser element 5. In the power source, a PN diode or PN junction sandwiching active layer 15 of semiconductor laser element 5 are biased in the forwards direction, so that carriers are injected from the respective first cladding layer 16 and second cladding layer 17 into active layer 15. In semiconductor laser element 5, when carriers are injected from first cladding layer 16 and second cladding layer 17, the stimulated emission phenomenon is produced in active layer 15, causing a laser beam to be emitted from first end face 5a of semiconductor laser element 5; this laser beam is discharged to outside housing 14 through glass window 13. As will be described, this laser beam is employed as the excitation beam of the optical amplifier.

When the temperature of this semiconductor laser element 5 is 20° C., the oscillation wavelength of the laser beam emitted from semiconductor laser element 5 is less than 1470 nm (for example 1465 nm). Thus, by setting the oscillation wavelength of the laser beam at 20° C. ambient on the short wavelength side of 1480 nm, which is the wavelength of the peak of the gain in an Er-doped optical fiber 28, as will be described, the amount of change of the gain in the EDF with respect to the amount of change of oscillation wavelength can be made satisfactorily small. Consequently, the difference of the gain in the Er-doped optical fiber 28, when the temperature of the semiconductor laser element 5 is high and when it is low, as will be described, can be made satisfactorily small. Also, by setting the oscillation wavelength of the laser beam at 20° C. ambient on the short wavelength side of 1480 nm, which is the wavelength of the peak gain in an Er-doped optical fiber 28, as will be described, optical amplification can be performed with a small NF (Noise Figure), even when the oscillation wavelength shifts to a region of longer wavelength than 1470 nm, due to rise in temperature of semiconductor laser element 5.

In order to make the oscillation wavelength of the laser beam in semiconductor laser element 5 at 20° C. ambient less than 1470 nm, for example n-type InP semiconductor substrate is employed as semiconductor substrate 18 and $In_{1-X}Ga_XAs_{1-Y}P_Y$ is employed as active layer 15. To obtain an oscillation wavelength of the laser beam at 20° C. ambient of 1465 nm, it is necessary to make X=0.34 and Y=0.27.

It should be noted that the oscillation wavelength of the laser beam at 20° C. ambient is not restricted to being 1465 nm as described above, so long as it is less than 1470 nm. The oscillation wavelength of the laser beam may therefore be 1460 nm or less or 1455 nm or less. However, the oscillation wavelength of the laser beam is at least 1440 nm. In order to make the oscillation wavelength 1440 nm or more, for example, the first cladding layer 16 may include an n-type InP semiconductor and the second cladding layer 17 may include a p-type InP semiconductor. Since first cladding layer 16 and second cladding layer 17 should be of mutually different conductivity type, it is also possible that the first cladding layer 16 includes a p-type InP semiconductor while the second cladding layer 17 includes an n-type InP semiconductor.

In order to obtain the desired oscillation wavelength of the laser light, it is necessary to suitably alter X and Y of $In_{1-X}Ga_XAs_{1-Y}P_Y$ constituting the constituent elements used in active layer 15.

Figure 3:
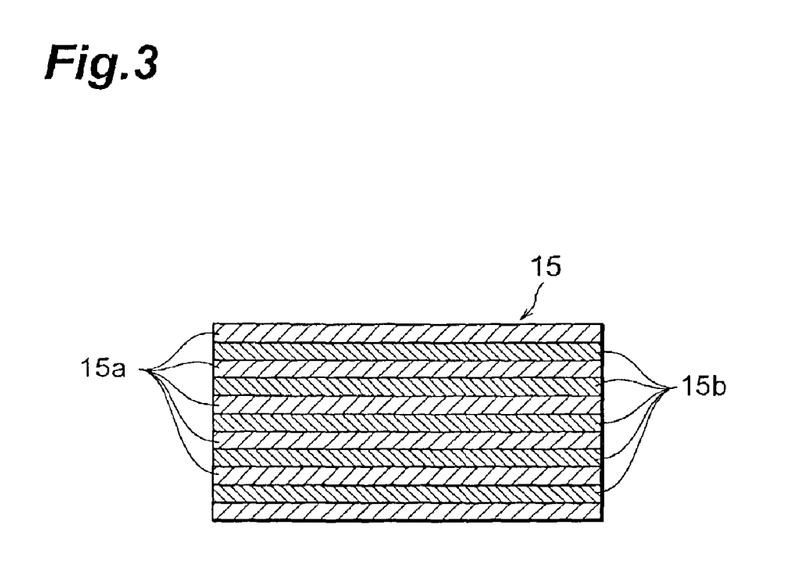
FIG. 3 is a cross-sectional view illustrating a multiple quantum well construction in an active layer.

Preferably, the active layer 15 in the semiconductor laser element 5 has a multiple quantum well structure. That is, preferably active layer 15 is constituted by laminating thin films of mutually different composition. In this way, absorption loss in active layer 15 can be reduced. The multiple quantum well structure in active layer 15 may be constituted for example by alternately laminating thin films 15a, 15b of InGaAsP of different mixed crystal ratio (see FIG. 3). Thin films 15a function as barrier layers and thin films 15b function as well layers.

Next, an embodiment of an optical amplifier 21 according to the present invention will be described.

Figure 4:
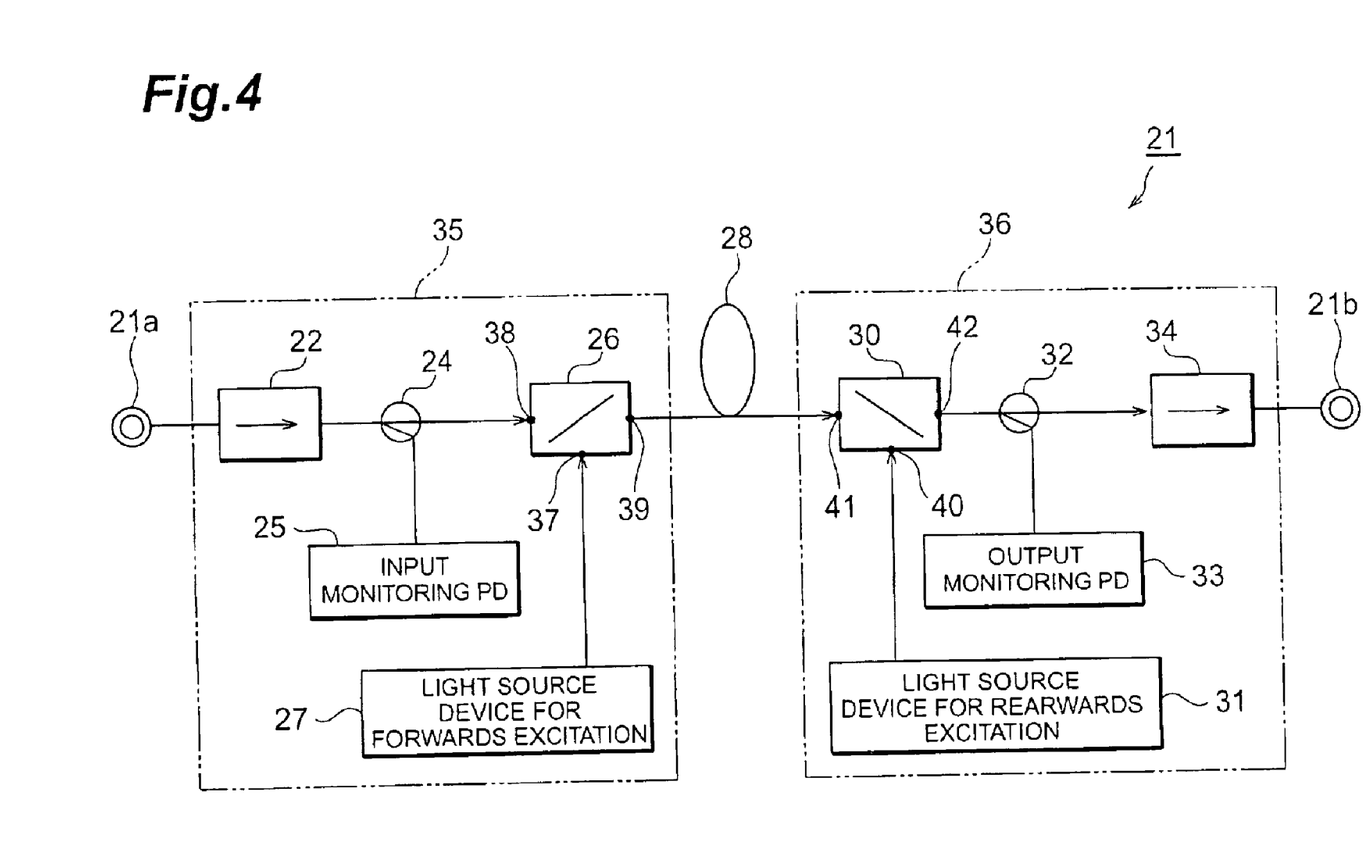
FIG. 4 is a layout diagram illustrating an embodiment of an optical amplifier according to the present invention.

FIG. 4 is a constructional diagram of an optical amplifier 21 according to this embodiment. In FIG. 4, optical amplifier 21 according to this embodiment comprises an input terminal 21a where a signal beam is input and an output terminal 21b where a signal beam is output. The signal beam is input from input terminal 21a and is output from output terminal 21b through input beam isolator 22, first branching element 24, first optical multiplexer 26, Er-doped optical fiber 28, second optical multiplexer 30, second branching element 32 and output beam isolator 34. Hereinbelow, the direction from input terminal 21a to output terminal 21b is termed "forwards" and the direction from output terminal 21b to input terminal 21a is termed "backwards".

Optical amplifier 21 comprises an input monitoring photo diode 25 that monitors the signal beam that is branched by first branching element 24 and an output monitoring photo diode 33 that monitors the signal beam that is branched by second branching element 32. In addition, optical amplifier 21 comprises a forwards excitation light source device 27 that emits an excitation beam towards first optical multiplexer 26 and a rearwards excitation light source device 31 that emits an excitation beam towards second optical multiplexer 30.

An optical module 35 for forwards excitation (excitation in the forwards direction) is constituted by input beam isolator 22, first branching element 24, input monitoring photo diode 25, first optical multiplexer 26 and forwards excitation light source device 27; an optical module 35 for rearwards excitation (excitation in the rearwards direction) is constituted by second optical multiplexer 30, rearwards excitation light source device 31, second branching element 32, output monitoring photo diode 33 and output beam isolator 34.

The chief structural elements of the structural elements mentioned above are described below in detail. Er-doped optical fiber 28 is a silica-based optical fiber whose core is doped with Er. The Er is excited by the excitation beam that is output from forwards excitation light source devices 27, 31 and emits stimulated emission light of practically the same wavelength as this signal light on the input of a signal beam that is input from input terminal 21a. The Er element is excited employing a wavelength of 1480 nm. Also, when a signal beam of 1550 nm wavelength band is input in a condition in which the Er element has been excited, stimulated emission light of the 1550 nm band is emitted from this Er element i.e. the signal beam is amplified. Since this 1550 nm wavelength band is the wavelength band of minimum loss in a silica-based optical fiber, a signal beam of the 1550 nm wavelength band is frequently employed in optical communication and there are very many applications for an optical amplifier using EDF. Also, Er-doped optical fiber 28 has a prescribed length (for example 30 m) in order to ensure a fixed amplification factor and is coiled to form a coil. Usually the Er-doped optical fiber 28 is also doped with Ge and Al in order to expand the signal bandwidth.

On the side of input terminal 21a, which is at the end of Er-doped optical fiber 28, there is provided a first optical multiplexer 26. First optical multiplexer 26 is provided with a first input 37 that receives an excitation beam (hereinbelow termed "forwards excitation beam") emitted from forwards excitation light source device 27, a second input 38 that receives a signal beam that is input from input terminal 21a, and a first output 39 that outputs the signal beam received by second input 38 and the forwards excitation beam that is input from first input 37.

Likewise, a second optical multiplexer 30 is provided on the side of output terminal 21b, which is at the end of Er-doped optical fiber 28. Second optical multiplexer 30 comprises a third input 40 that inputs an excitation beam (hereinbelow referred to as "rearwards excitation beam") that is emitted from rearwards excitation light source device 31, a fourth input 41 that inputs the aforesaid signal beam that is output from Er-doped optical fiber 28 and outputs the rearwards excitation beam that is input by third input 40, and a second output 42 that outputs the signal beam that is input by fourth input 41.

For the first optical multiplexer 26 and second optical multiplexer 30 there are employed for example multiplexers equipped with multi-layered film filters wherein multi-layered film filters formed by alternately laminating substances of two different refractive indices are inserted.

Excitation light source devices 27 and 31 output excitation beams of the same wavelength. The excitation light source device 1 described above (see FIG. 1 and FIG. 2) may be employed for these excitation light source devices 27, 31. The oscillation wavelength of the laser beam when the semiconductor laser element 5 is at 20° C. ambient is therefore for example 1465 nm.

Also, thanks to the above construction, since the forwards excitation beam emitted by excitation light source device 27 advances in the direction of excitation light source device 31 due to the action of second optical multiplexer 30, the forwards excitation beam is prevented from advancing to the rear of second optical multiplexer 30. Likewise, since the rearwards excitation beam emitted by excitation light source device 31 advances in the direction of excitation light source 27 due to the action of first optical multiplexer 26, the rearwards excitation beam is prevented from advancing forwards of first optical multiplexer 26.

In front of first optical multiplexer 26 and to the rear of second optical multiplexer 30, there are respectively provided an input beam isolator 22 and an output beam isolator 34 that selectively pass light advancing forwards. That is, the input beam isolator 22 passes the signal beam advancing forwards after being input from input terminal 21a and blocks light advancing rearwards, such as the rearwards excitation beam emitted from excitation light source device 31 and reflected light such as the signal beam produced by optical components to the rear. Also, output beam isolator 34 passes the signal beam which is advancing forwards and blocks light that is advancing rearwards, such as noise entering from output terminal 21a.

Next, the action and benefits of an optical amplifier 21 according to this embodiment will be described. First of all, in forwards excitation light source device 27, when voltage is applied by the power source to semiconductor laser element 5 through first conductive pin 7 and second conductive pin 9, since the power source forward-biases the PN diode or PN junction sandwiching active layer 15 of semiconductor laser element 5, carriers are injected into active layer 15 from first cladding layer 16 and second cladding layer 17, respectively. When carriers are injected from first cladding layer 16 and second cladding layer 17 in semiconductor laser element 5, light is generated in active layer 15.

This light is then directed through active layer 15 towards the first end face 5a and second end face 5b and the light that is reflected at second end face 5b is directed towards first end face 5a. Meanwhile, this light generates laser light by the stimulated emission phenomenon. The laser beam arriving at the first end face 5a passes through first end face 5a and is emitted from the semiconductor laser element 5. The emitted laser beam is employed as an excitation beam for exciting the Er element.

The excitation beam that is emitted from semiconductor laser element 5 in this way is input to the Er-doped optical fiber 28 through first optical multiplexer 26.

In rearwards excitation light source device 31 also, an excitation beam is emitted in the same way as in the case of the forwards excitation light source device 27 and this excitation beam is input to Er-doped optical fiber 28 through second optical multiplexer 30.

On the other hand, when a signal beam in the 1550 nm band is input to input terminal 21a, the signal beam is input into Er-doped optical fiber 28 through input optical isolator 22, first branching element 24 and first optical multiplexer 26.

An inverted distribution condition is then formed in the Er in the Er-doped optical fiber 28 by the excitation beam, so that, when a signal beam is input to the Er-doped optical fiber 28, the stimulated emission phenomenon is produced by the signal beam, causing the signal beam to be amplified and emitted from the Er-doped optical fiber 28.

Thus, in forwards excitation light source device 27 and rearwards excitation light source device 31, semiconductor laser element 5 generates an excitation beam of oscillation wavelength less than 1470 nm at 20° C. ambient. In this way, by setting the oscillation wavelength on the short wavelength side of 1480 nm, which is the wavelength of the peak gain in Er-doped optical fiber 28, the amount of change of gain in Er-doped optical fiber 28 with respect to the amount of change of oscillation wavelength can be made sufficiently small, so the wavelength dependence of the gain in the Er-doped optical fiber can be made sufficiently small. Consequently, the difference of gain when the temperature of semiconductor laser element 5 is high and when it is low it can be made sufficiently small. Also, by setting the oscillation wavelength on the short wavelength side of 1480 nm, which is the peak wavelength of gain in Er-doped optical fiber 28, the NF can be made sufficiently small and the wavelength dependence of the NF can be made small.

The signal beam that is amplified in this way is emitted from Er-doped optical fiber 28 before being output from output terminal 21b through second optical multiplexer 30, second branching element 32 and output beam isolator 34.

Figure 5:
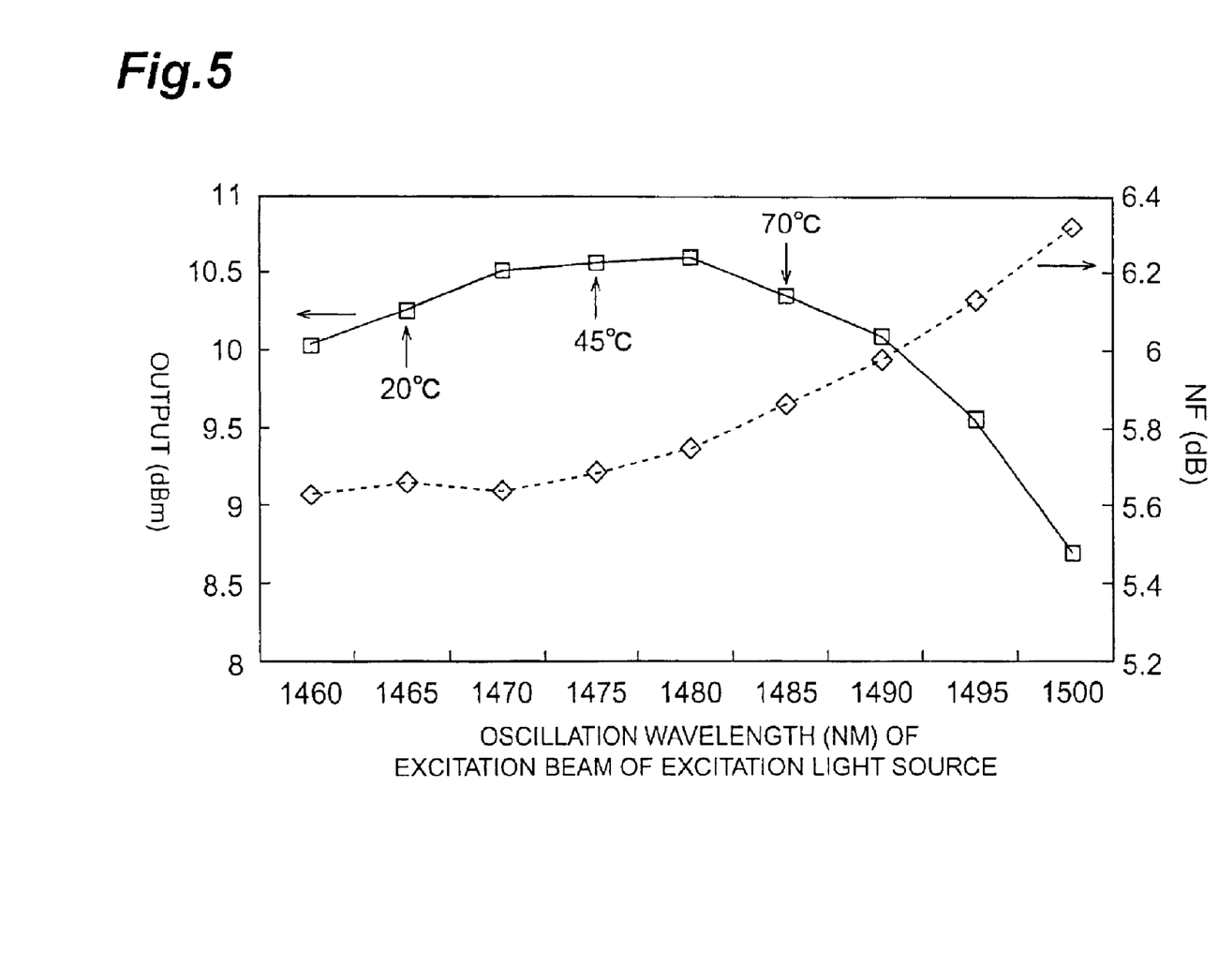
FIG. 5 is a graph illustrating the results of a simulation test of the output characteristic of an optical amplifier according to the present invention.

FIG. 5 is a graph illustrating the results of a simulation test of output characteristic of an optical amplifier according to the present invention, the output power and NF (Noise Figure) of the signal beam being plotted against the oscillation wavelength of the excitation beam emitted from semiconductor laser element 5. In FIG. 5, a square symbol indicates the output power (dBm) of the signal beam and a diamond symbol indicates the NF (dB). The computer simulation was performed in accordance with the following conditions in an optical amplifier as shown in FIG. 4.

Input of signal beam: −14 dBm
Signal beam wavelength: 1550 nm
EDF length: 13 m
Forwards excitation light source device output: 16 mW
Rearwards excitation light source device output: 16 mW
Excitation light source device oscillation wavelength (20° C.): 1460 to 1500 nm.

From the results shown in FIG. 5, it can be seen that the output power of the signal beam at 1480 nm is extremely large and the output power drops both on the long wavelength side and the short wavelength side of this. However, the inventors noted that, when the oscillation wavelength of the excitation beam that is emitted from the semiconductor laser element is on the short wavelength side of 1480 nm, the proportional variation of the output power with respect to the oscillation wavelength is smaller than in the case where this is on the long wavelength side and furthermore the output power diminishes abruptly in the long wavelength region. In addition, the inventors noted that, as shown in FIG. 5, the oscillation wavelength of the semiconductor laser element shifts to the long wavelength side as the temperature becomes higher.

Furthermore, as can be seen from FIG. 5, the region of small NF and small wavelength dependence is a region of shorter wavelength than the peak gain wavelength.

Consequently, by setting the oscillation wavelength of the excitation beam at 20° C. ambient on the short wavelength side of 1480 nm, the difference of output power between the cases where the temperature of the semiconductor laser element is high and where it is low can be reduced. That is, by setting the operating temperature range on the short wavelength side of 1480 nm, the difference of output power between the cases where the temperature of the semiconductor laser element is high and where it is low can be reduced.

Figure 6:
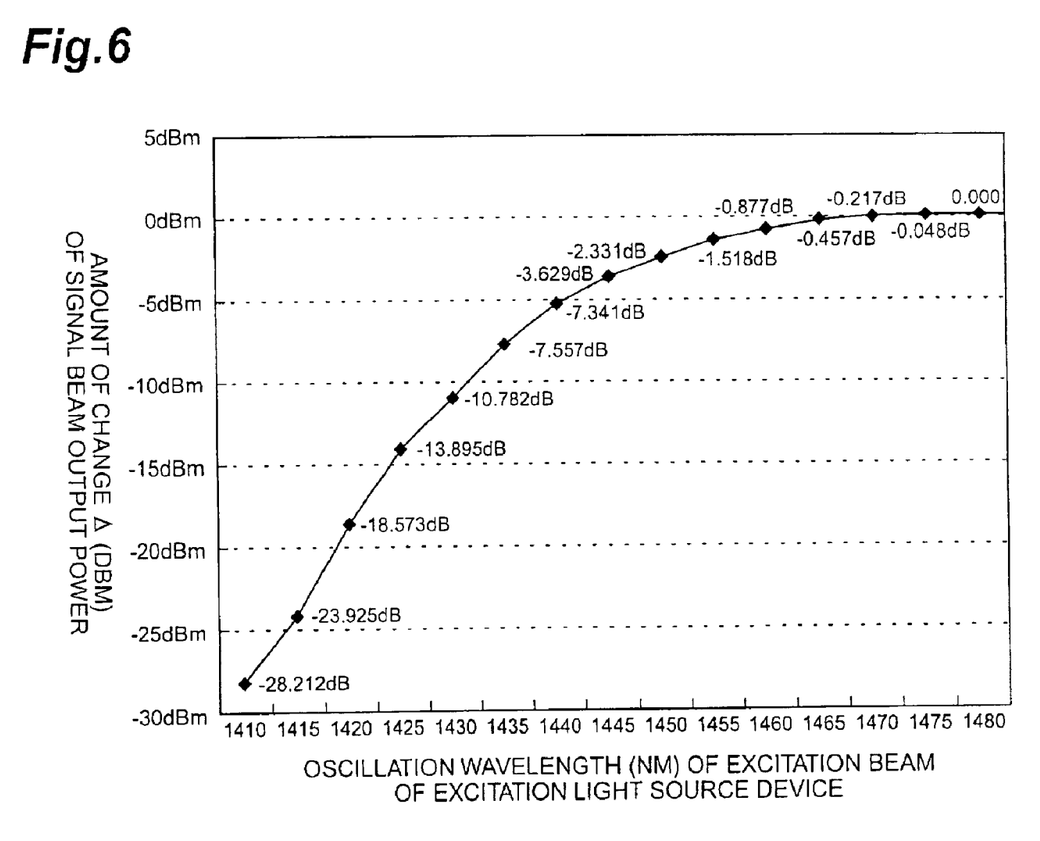
FIG. 6 is a graph illustrating the test results of the output characteristic of an optical amplifier when the oscillation wavelength of the excitation beam is in particular on the short wavelength side of 1480 nm.

FIG. 6 is a graph illustrating the results of a test of output characteristic of an optical amplifier in the case where in particular the oscillation wavelength of the excitation beam is on the short wavelength side of 1480 nm; only the output power of the signal beam is plotted with respect to the oscillation wavelength of the excitation beam that is output from the semiconductor laser element. In FIG. 6, "[black diamond symbol]" indicates the output power (dBm) of the signal beam. The vertical axis indicates the amount of change (Δ) of the output power with respect to the output power of the signal beam when the oscillation wavelength of the excitation beam is 1480 nm. The test was conducted under the following conditions with the optical amplifier shown in FIG. 4.

Output of signal beam: −15 dBm
Signal beam wavelength: 1550 nm
EDF length: 17 m
Forwards excitation light source device output: 13 mW
Rearwards excitation light source device output: 13 mW
Oscillation wavelength of excitation light source device (20° C.): 1410 to 1480 nm.

From the results shown in FIG. 6, it can be seen that the output power of the signal beam drops on going towards the short wavelength side, when the oscillation wavelength of the excitation beam is on the short wavelength side of 1480 nm.

The present invention is not restricted to the embodiment described above. For example, although, in the embodiment described above, optical amplifier 21 comprised an optical module 35 for forwards excitation and an optical module 36 for rearwards excitation, it would be possible to provide only one or other of these.

Also, although, in the embodiment described above, the oscillation wavelength was made less than 1470 nm for both forwards excitation light source device 27 and rearwards excitation light source device 31, it would be sufficient to make at least either one of forwards excitation light source device 27 and rearwards excitation light source device 31 have an oscillation wavelength of less than 1470 nm.

As described above, with an optical amplifier according to the present invention, by setting the oscillation wavelength of the excitation light source device on the short wavelength side of 1480 nm, which is the peak wavelength of the gain in an erbium-doped optical fiber, it is possible to make the amount of change of gain in the erbium-doped optical fiber satisfactorily small with respect to the amount of change of oscillation wavelength, and the wavelength dependence of the gain in an erbium-doped optical fiber can thereby be made satisfactorily small. The difference between the gain in the erbium-doped optical fiber when the temperature of the semiconductor laser element is high and when it is low can therefore be made satisfactorily small. Also, by setting the oscillation wavelength on the short wavelength side of 1480 nm, which is the peak wavelength of gain in an erbium-doped optical fiber, the NF can be made satisfactorily small and the wavelength dependence of the NF can be made small.

What is claimed is:

1. An optical amplifier comprising:
   an erbium-doped optical fiber;
   an excitation light source device having a semiconductor laser element that generates an excitation beam and a housing that accommodates said semiconductor laser element; and
   an optical multiplexer having a first input optically coupled with said excitation light source device, a second input for receiving a signal beam and an output for supplying said excitation beam and signal beam to said erbium-doped optical fiber;
   wherein said semiconductor laser element comprises:
   a first cladding layer that includes a chemical compound semiconductor of first conductivity type;
   a second cladding layer that includes a chemical compound semiconductor of second conductivity type; and
   an active layer including a chemical compound semiconductor, provided between said first cladding layer and said second cladding layer and constituted such that the oscillation wavelength of said semiconductor laser element at 20° C. is less than 1470 nm but not less than 1440 nm.

2. The optical amplifier according to claim 1 wherein said housing constituting said excitation light source device comprises a mounting member made of metal and said semiconductor laser element is arranged on said mounting member.

3. The optical amplifier according to claim 1 wherein said housing constituting said excitation light source device comprises:
   a stem having a mounting portion on which said semiconductor laser element is mounted such that the optical axis of said semiconductor laser element faces a prescribed axial direction, a plurality of conductive pins having portions extending in said prescribed axial direction and an optical window through which passes light from said semiconductor laser element; and
   a cover member arranged on said stem so as to cover said semiconductor laser element.

4. An optical amplifier comprising:
   an erbium-doped optical fiber;
   an excitation light source device having a semiconductor laser element that generates an excitation beam and a housing that accommodates said semiconductor laser element; and
   an optical multiplexer having a first input optically coupled with said excitation light source device, a second input for receiving a signal beam, and an output for supplying said excitation beam and signal beam to said erbium-doped optical fiber;
   wherein said semiconductor laser element comprises:
   a first cladding layer that includes InP semiconductor of first conductivity type;
   a second cladding layer that includes InP semiconductor of second conductivity type; and
   an active layer including a chemical compound semiconductor, provided between said first cladding layer and said second cladding layer and constituted such that the oscillation wavelength of said semiconductor laser element at 20° C. is less than 1470 nm.

5. The optical amplifier according to claim 4 wherein said housing constituting said excitation light source device comprises a mounting member made of metal and said semiconductor laser element is arranged on said mounting member.

6. The optical amplifier according to claim 4 wherein said housing constituting said excitation light source device comprises:
   a stem having a mounting portion on which said semiconductor laser element is mounted such that the optical axis of said semiconductor laser element faces a prescribed axial direction, a plurality of conductive pins having portions extending in said prescribed axial direction and an optical window through which passes light from said semiconductor laser element; and
   a cover member arranged on said stem so as to cover said semiconductor laser element.

7. An optical amplifier comprising:
   an erbium-doped optical fiber;
   an excitation light source device having a semiconductor laser element that generates an excitation beam and a housing that accommodates said semiconductor laser element; and
   an optical multiplexer having a first input optically coupled with said excitation light source device, a second input for receiving a signal beam, and an output for supplying said excitation beam and signal beam to said erbium-doped optical fiber;
   wherein said semiconductor laser element comprises:
   a first cladding layer that includes InP semiconductor of first conductivity type;
   a second cladding layer that includes InP semiconductor of second conductivity type; and
   an active layer that is provided between said first cladding layer and said second cladding layer, and that has a multiple quantum well construction having a barrier layer and well layer including GaInAsP semiconductor and constituted such that the oscillation wavelength of this semiconductor laser element at 20° C. is less than 1470 nm.

8. The optical amplifier according to claim 7 wherein said housing constituting said excitation light source device comprises a mounting member made of metal and said semiconductor laser element is arranged on said mounting member.

9. The optical amplifier according to claim 7 wherein said housing constituting said excitation light source device comprises:
   a stem having a mounting portion on which said semiconductor laser element is mounted such that the optical axis of said semiconductor laser element faces a prescribed axial direction, a plurality of conductive pins having portions extending in said prescribed axial direction and an optical window through which passes light from said semiconductor laser element; and
   a cover member arranged on said stem so as to cover said semiconductor laser element.

10. An optical amplifier comprising:
    an erbium-doped optical fiber;
    a first excitation light source device constituted by said excitation light source device of an optical amplifier according to claim 1;
    a first optical multiplexer having a first input optically coupled with said first excitation light source device, a second input for receiving a signal beam, and a first output for outputting said excitation beam and signal beam to said erbium-doped optical fiber;
    a second excitation light source device constituted by said excitation light source device of an optical amplifier according to claim 1; and a second optical multiplexer having a third input optically coupled with said second excitation light source device, a fourth input for receiving a signal beam and outputting an excitation beam to said erbium-doped optical fiber, and a second output for outputting said signal beam.

11. An optical amplifier comprising:

an erbium-doped optical fiber;

a first excitation light source device constituted by said excitation light source device of an optical amplifier according to any of claim 4;

a first optical multiplexer having a first input optically coupled with said first excitation light source device, a second input for receiving a signal beam, and a first output for outputting said excitation beam and signal beam to said erbium-doped optical fiber;

a second excitation light source device constituted by said excitation light source device of an optical amplifier according to claim 4; and a second optical multiplexer having a third input optically coupled with said second excitation light source device, a fourth input for receiving a signal beam and outputting an excitation beam to said erbium-doped optical fiber, and a second output for outputting said signal beam.

12. An optical amplifier comprising:

an erbium-doped optical fiber;

a first excitation light source device constituted by said excitation light source device of an optical amplifier according to claim 7;

a first optical multiplexer having a first input optically coupled with said first excitation light source device, a second input for receiving a signal beam, and a first output for outputting said excitation beam and signal beam to said erbium-doped optical fiber;

a second excitation light source device constituted by said excitation light source device of an optical amplifier according to claim 7; and a second optical multiplexer having a third input optically coupled with said second excitation light source device, a fourth input for receiving a signal beam and outputting an excitation beam to said erbium-doped optical fiber, and a second output for outputting said signal beam.

13. The optical amplifier according to claim 1 wherein said excitation light source device is a non-temperature regulated light source device.

14. The optical amplifier according to claim 4 wherein said excitation light source device is a non-temperature regulated light source device.

15. The optical amplifier according to claim 7 wherein said excitation light source device is a non-temperature regulated light source device.

* * * * *